(12) United States Patent
Uprety et al.

(10) Patent No.: US 12,338,525 B2
(45) Date of Patent: Jun. 24, 2025

(54) TRANSPARENT CONDUCTING INDIUM DOPED TIN OXIDE

(71) Applicant: PPG Industries Ohio, INC., Cleveland, OH (US)

(72) Inventors: Krishna K. Uprety, Valencia, CA (US); Khushroo H. Lakdawala, Santa Clarita, CA (US); Russell Shellenberger, Simi Valley, CA (US); Mahmood Ahmad Ali, Porter Ranch, CA (US)

(73) Assignee: PPG Industries Ohio, Inc., Cleveland, OH (US)

( * ) Notice: Subject to any disclaimer, the term of this patent is extended or adjusted under 35 U.S.C. 154(b) by 991 days.

(21) Appl. No.: 16/000,821

(22) Filed: Jun. 5, 2018

(65) Prior Publication Data
US 2018/0291497 A1 Oct. 11, 2018

Related U.S. Application Data

(62) Division of application No. 14/292,200, filed on May 30, 2014, now Pat. No. 9,988,707.

(51) Int. Cl.
*C23C 14/08* (2006.01)
*C03C 17/23* (2006.01)
*C03C 17/245* (2006.01)

(52) U.S. Cl.
CPC ............ *C23C 14/086* (2013.01); *C03C 17/23* (2013.01); *C03C 17/245* (2013.01)

(58) Field of Classification Search
CPC ....... C03C 17/23; C03C 17/245; C23C 14/08; C23C 14/086; C23C 14/34

USPC ..................................................... 204/192.29
See application file for complete search history.

(56) References Cited

U.S. PATENT DOCUMENTS

| | | | |
|---|---|---|---|
| 4,132,624 A | 1/1979 | King et al. | |
| 4,959,257 A | 9/1990 | Mukherjee | |
| 5,045,235 A * | 9/1991 | Ohara | H01B 1/08 252/501.1 |

(Continued)

FOREIGN PATENT DOCUMENTS

| | | | |
|---|---|---|---|
| GB | 2361245 | * | 4/2000 |
| GB | 2 361 245 A | | 10/2001 |

(Continued)

OTHER PUBLICATIONS

Machine Translation 59-71205 (Year: 1984).*

(Continued)

*Primary Examiner* — Rodney G McDonald
(74) *Attorney, Agent, or Firm* — Leech Tishman Fuscaldo & Lampl

(57) ABSTRACT

A method of manufacturing indium tin oxide includes sputtering indium and tin from a target onto a substrate, the sputtering including moving the target along a path over the substrate. The indium tin oxide may have a sheet resistance less than 0.5 $\Omega/\square$. An indium film includes: a first moving target sputtered indium tin oxide layer; a second moving target sputtered indium tin oxide layer on the first moving target sputtered indium tin oxide layer; and a third moving target sputtered indium tin oxide layer on the second moving target sputtered indium tin oxide layer. A transparency includes the indium tin oxide, and a flying vehicle includes the transparency.

14 Claims, 8 Drawing Sheets

(56) References Cited

U.S. PATENT DOCUMENTS

| | | |
|---|---|---|
| 6,187,150 B1 | 2/2001 | Yoshimi et al. |
| 6,617,056 B1 | 9/2003 | Hara et al. |
| 6,703,130 B2 | 3/2004 | Ogura et al. |
| 6,743,488 B2 | 6/2004 | Memarian et al. |
| 6,787,204 B2 | 9/2004 | Chaussade et al. |
| 6,849,165 B2 | 2/2005 | Klöppel et al. |
| 7,147,805 B2 | 12/2006 | Miyoshi |
| 8,080,141 B2 | 12/2011 | Krasnov |
| 8,252,206 B2 | 8/2012 | Ikisawa et al. |
| 8,257,830 B2 | 9/2012 | Bimanand et al. |
| 8,277,694 B2 | 10/2012 | Ikisawa et al. |
| 8,372,314 B2 | 2/2013 | Koo et al. |
| 8,411,348 B2 | 4/2013 | Valentin et al. |
| 8,445,373 B2 | 5/2013 | Broadway et al. |
| 8,511,841 B2 | 8/2013 | Varaprasad et al. |
| 8,524,337 B2 | 9/2013 | Lemmer et al. |
| 2003/0035906 A1 | 2/2003 | Memarian et al. |
| 2003/0042405 A1* | 3/2003 | Worley ............ H01L 31/173 257/E31.105 |
| 2004/0231973 A1 | 11/2004 | Sato et al. |
| 2010/0028684 A1 | 2/2010 | Mariscal et al. |
| 2010/0221489 A1 | 9/2010 | Lappalainen et al. |
| 2011/0033713 A1 | 2/2011 | Tamai et al. |
| 2011/0139612 A1 | 6/2011 | Na et al. |
| 2013/0052458 A1 | 2/2013 | Nagamoto et al. |
| 2013/0059065 A1 | 3/2013 | Krasnov |
| 2013/0284590 A1 | 10/2013 | Bender et al. |

FOREIGN PATENT DOCUMENTS

| | | |
|---|---|---|
| JP | S 5788028 A | 6/1982 |
| JP | 59-71205 * | 4/1984 |
| JP | 63-176472 A | 7/1988 |
| JP | 5-263228 | 10/1993 |
| JP | H10-219443 A | 8/1998 |
| JP | 2002-175733 A | 6/2002 |
| JP | 2002-350834 A | 12/2002 |
| RU | 94033355 A1 | 4/1996 |
| RU | 2075537 C1 | 3/1997 |
| RU | 2112076 C1 | 5/1998 |
| RU | 2181389 C2 | 4/2002 |
| RU | 2241065 C2 | 11/2004 |
| RU | 2274675 C1 | 4/2006 |
| RU | 2448197 C1 | 2/2012 |
| SU | 1499573 A1 | 3/1992 |
| WO | WO 2005/081055 * | 1/2005 |
| WO | WO2010090197 A1 | 8/2010 |
| WO | WO2011/061922 | 5/2011 |

OTHER PUBLICATIONS

English translation of Office action issued in corresponding Chinese Application No. 201580028918.x, issued May 7, 2019, 15 pages.
Canadian Office action dated Apr. 17, 2020, issued in corresponding Application No. 2948259, 4 pages.
English translation of Office action issued in corresponding Chinese Application No. 201580028918.x, issued Aug. 16, 2018, 18 pages.
English translation of Office action and Search Report issued in corresponding Russian Application No. 2016151659, issued Jul. 5, 2018, 8 pages.
English translation of Office action issued in related Japanese Application No. 2016-570853 issued Oct. 3, 2019, 4 pages.
English translation of Decision of Rejection issued in related Chinese Application No. 201580028918.x issued Oct. 10, 2019, 13 pages.
Bright, Clark I.; Multilayer ITO Coatings With High Transparency and Low Sheet Resistance (Conference Paper); Optical Interference Coatings; Banff, Canada; Jul. 15, 2001; 3 Pages.
Chen et al.; Indium Tin Oxide (ITO): Sputter Deposition Processes (Book); Handbook of Visual Display Technology; 2012, pp. 779-794.
Indium Corporation; Indium Tin Oxide (ITO) ($In_2O_3$):($SnO_2$); Webpage; <http://www.indium.com/inorganic-compounds/indium-compounds/indium-tin-oxide/> Date Accessed: Sep. 10, 2013; 1 Page.
Yang et al; Enhanced optical and electrical properties of ITO on a PET substrate by hydrogen plasma and HCl treatment (Journal); Journal of Physics D: Applied Physics; vol. 46, p. 25103-25103; Published Feb. 18, 2013; 4 Pages.
Mazur et al.; Sheet resistance and optical properties of ITO thin films deposited by magnetron sputtering with different $O_2$/Ar flow ratio (Article); 2010 International Students and Young Scientists Workshop; 2010 IEEE; 4 pages.
International Preliminary Report on Patentability and Written Opinion issued in PCT/US2015/020151, Dec. 6, 2016, 7 pages.
Office action issued in corresponding European Application No. 15712491.8, dated Feb. 6, 2018, 5 pages.
PCT International Search Report and Written Opinion for International Application No. PCT/US2015/020151 dated Jun. 15, 2015; 10 pages.
English translation of Office action issued in related Japanese Application No. 2016-570853, mailed Oct. 9, 2018, 3 pages.
English translation of the Office action issued in corresponding Russian Application No. 2016151659, Feb. 4, 2019, 6 pages.
Examination Report issued in related Canadian Application No. 2948259, May 19, 2021, 4 pages.
Examination Report issued in related Canadian Application No. 2,948,259, Dec. 3, 2021, 4 pages.

* cited by examiner

SEM HV: 12.10 kV
View field: 7.363 μm
WD: 23.59 mm
Det: SE Detector

TRANSPARENT CONDUCTING INDIUM DOPED TIN OXIDE

CROSS-REFERENCE TO RELATED APPLICATIONS

This application is a divisional application of U.S. patent application Ser. No. 14/292,200, filed May 30, 2014, issued as U.S. Pat. No. 9,988,707, the entire content of which is incorporated herein by reference.

BACKGROUND

Transparent conductive metal oxides (TCOs) are useful for a variety of applications as a result of their transparency and conductivity. For example, indium tin oxide is a transparent and conductive metal oxide that includes indium, tin and oxygen. Indium tin oxide may be formed on a substrate by sputtering from a target that is stationary relative to the substrate during the sputtering.

SUMMARY

According to an embodiment of the present disclosure, a method of manufacturing indium tin oxide includes sputtering indium and tin from a target onto a substrate to form the indium tin oxide over the substrate, the sputtering including moving the target relative to the substrate along a path over the substrate.

A sheet resistance of the indium tin oxide may be less than 0.5 Ω/□.

In some embodiments, the moving of the target includes moving the target from an end of the path to an other end of the path.

Moving the target from the end of the path to the other end of the path may form a first layer of indium tin oxide.

The end of the path may be over an end of the substrate and the other end of the path may be over an other end of the substrate.

In some embodiments, the method further includes moving the target from the other end of the path to the end of the path to complete a cycle.

Moving the target from the other end of the path to the end of the path may form a second layer of indium tin oxide on the first layer of indium tin oxide.

The moving of the target may include completing a plurality of cycles.

In some embodiments, completing the plurality of cycles forms a plurality of layers of indium tin oxide.

The moving of the target may include completing 2 or more cycles.

The sputtering may be performed at a temperature in a range of room temperature to about 700° F.

The sputtering may be performed for a period of time of about 1 minute or more.

The sputtering may be performed while flowing an inert gas over the substrate at an inert gas flow rate in a range of about 100 to about 600 sccm, and while flowing oxygen over the substrate at an oxygen flow rate in a range of about 5 to 400 sccm.

In some embodiments, a portion of the indium tin oxide anneals as the target moves away from the portion of the indium tin oxide.

The moving of the target relative to the substrate may include moving the target and/or the substrate.

According to an embodiment of the present disclosure, an indium tin oxide film includes indium tin oxide manufactured according to a method disclosed herein.

According another embodiment of the present disclosure, a transparency of a flying vehicle, ground vehicle, display device or electrochromic window includes the indium tin oxide film.

According to another embodiment of the present disclosure, a flying vehicle includes the transparency.

According to another embodiment of the present disclosure, an indium tin oxide film includes: a first moving target sputtered indium tin oxide layer; a second moving target sputtered indium tin oxide layer on the first moving target sputtered indium tin oxide layer; and a third moving target sputtered indium tin oxide layer on the second moving target sputtered indium tin oxide layer.

The indium tin oxide film may have a thickness in a range of 10 nm to 4 μm. In other embodiments, the indium tin oxide film has a thickness in a range of 10 nm to 900 nm.

A sheet resistance of the indium tin oxide film may be less than 0.5 Ω/□.

According to another embodiment of the present disclosure, a transparency of a flying vehicle, ground vehicle, display device or electrochromic window includes the indium tin oxide film.

According to another embodiment of the present disclosure, a flying vehicle includes the transparency.

According to another embodiment of the present disclosure, a display device includes the transparency.

According to another embodiment of the present disclosure, an electrochromic window includes the transparency.

According to still another embodiment of the present disclosure, an indium tin oxide film includes a plurality of indium tin oxide layers.

BRIEF DESCRIPTION OF THE DRAWINGS

The accompanying drawings, together with the specification, illustrate embodiments of the present invention, and, together with the description, serve to explain the principles of the present invention.

DETAILED DESCRIPTION

Figure 1:
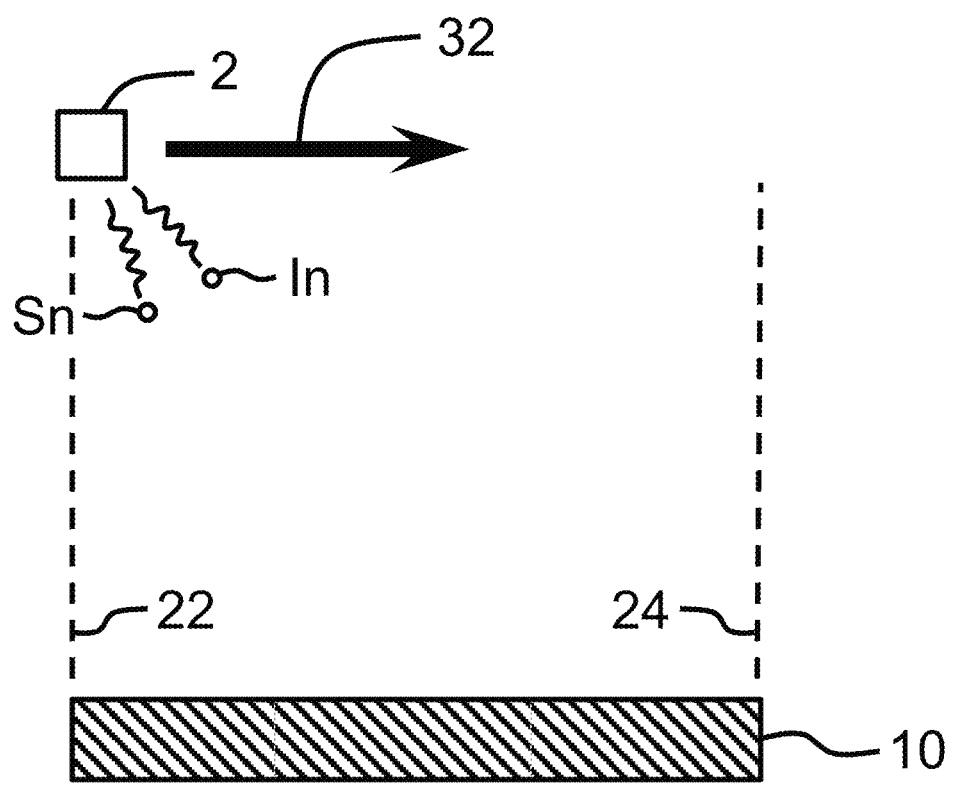
FIGS. 1-4 are cross-sectional views of a substrate and a sputtering target illustrating an embodiment of a method of manufacturing indium tin oxide.

In the following detailed description, only certain embodiments of the present invention are shown and described, by way of illustration. As those skilled in the art would recognize, the invention may be embodied in many different forms and should not be construed as being limited to the embodiments set forth herein. Also, in the context of the present application, when a first element is referred to as being "on" or "over" a second element, it may be directly on or over the second element or be indirectly on or over the second element with one or more intervening elements interposed therebetween, and "on" and "over" may each mean "under" or "below." For example, a layer that is "on" or "over" another layer may also be considered "below" the other layer, and vice versa, depending upon the point of view. The substrate and transparency described herein may be made of glass, polymeric (e.g., plastic) or other suitable materials, may be coated or uncoated, and may form a canopy, a window or a windshield of a ground vehicle (e.g., a car), aircraft (e.g., an Embraer windshield), boat, building, or any other suitable vehicle or structure. Additionally, the substrate and transparency described herein may be included in a display (e.g., an LCD display) or electrochromic window. In the drawings, some features, such as the thicknesses of layers and regions, may be magnified or exaggerated for clarity. The present disclosure is not limited to the sizes and thicknesses shown in the drawings. As used herein, the term "plurality" refers to two or more. Like reference numerals designate like elements throughout the specification.

Aspects of embodiments of the present disclosure relate to methods of manufacturing a low ohm transparent conductive metal oxide (e.g., indium tin oxide), such as a highly ductile, transparent and conductive indium tin oxide. As used herein, the term "low ohm" refers to a sheet resistance of less than $0.5\Omega/\square$ (ohms per square), but the present disclosure is not limited thereto. In some embodiments, low ohm indium tin oxide has a sheet resistance of less than $0.4\Omega/\square$ (e.g., a sheet resistance of 0.3 to $0.4\Omega/\square$). Embodiments of the transparent conductive metal oxide (e.g., indium tin oxide) disclosed herein are suitable for use as an anti-static coating, a heater layer (e.g., for defogging and/or de-icing), and/or an electromagnetic interference (EMI) shielding layer, and embodiments of the indium tin oxide may be used in a flat panel display (e.g., an LCD display), an electrochromic window, a solar cell, a ground vehicle (e.g., a car), a flying vehicle (e.g., an aircraft), a boat, a building, or any other suitable vehicle or structure, but the present disclosure is not limited thereto.

According to an embodiment of the present disclosure, a method of manufacturing indium tin oxide includes sputtering indium and tin from a target onto a substrate. For example, the sputtering may include sputtering indium and tin from the target (e.g., a metallic target) onto the substrate or sputtering indium, tin and oxygen from the target (e.g., a ceramic target) onto the substrate. The sputtering may be carried out in an atmosphere including an inert gas and oxygen. The sputtering includes moving the target and/or substrate relative to one another. For example, the sputtering may include moving the target along a path over the substrate, and/or moving the substrate along a path under the target. Thus, as used herein, when used with respect to the target and substrate, the terms "move," "moving," and "moved" refer to relative movement of the target and substrate with respect to one another. In some embodiments, the resultant indium tin oxide has a sheet resistance of less than $0.5\Omega/\square$, a sheet resistance of less than $0.4\Omega/\square$, or a sheet resistance of 0.3 to 0.4 $\Omega/\square$.

For example, FIGS. 1-4 are cross-sectional views of a substrate and a sputtering target that illustrate an example embodiment of a method of manufacturing indium tin oxide. In the embodiment shown in FIG. 1, a rectangular target 2 moves relative to a substrate 10 along a path over the substrate indicated by an arrow 32 (e.g., a first direction along the path). The target is not limited to a rectangular shape, but on the contrary may have any suitable shape (e.g., a cylinder). The shape of the target may be changed according to a shape (or contour) of the substrate. For example, the target may have a "U" shape, a "J" shape, or a "V" shape, but the present disclosure is not limited thereto. The target may be made of any suitable material, such as a ceramic indium, tin and oxygen material (e.g., $In_2O_3$ and $Sn_2O_4$), or an alloy of indium and tin, but the present disclosure is not limited thereto. The target 2 sputters indium (In) and tin (Sn) onto the substrate 10 as the target moves along the path indicated by the arrow 32 (e.g., the first direction along the path). In FIGS. 1-4, the movement of the target 2 is shown relative to the substrate 10. Thus, the movement of the target 2 shown in FIGS. 1-4 may be accomplished by moving the target and holding the substrate stationary, moving the substrate and holding the target stationary, or moving both the target and the substrate concurrently (or simultaneously), for example, by moving the substrate and the target in different directions or by moving the substrate and target in the same (or substantially the same) direction at different rates. Indeed, throughout the present disclosure, the movement of the target is described relative to the substrate, and any movement of the target described herein may be accomplished by moving the target and/or substrate as described above. The target and the substrate may be moved in the same or opposite directions relative to one another, and the target and the substrate may be moved at the same or different speeds (or rates). In some embodiments, the target moves relative to the target in substantially a single (or sole) plane (e.g., the target moves linearly relative to the substrate). For example, in some embodiments, the target moves substantially horizontally relative to a flat or curved substrate. In other embodiments, the substrate is curved and the movement of the target corresponds to a curvature of the substrate.

The target may be any suitable size or shape, and the size or shape of the target may be selected based on the size or shape (or contour) of the substrate to be coated (e.g., a length of the target may correspond to or be equal to a length or width of the substrate). In some embodiments, the target may be substantially smaller than the substrate (e.g., a length of the target may be one half or less than a length of the substrate), and the target may move in two dimensions (e.g., the target may move in two dimensions in a same plane) to fully (or substantially fully) coat an entire (or substantially entire) surface of the substrate. For example, when a length of the target is substantially smaller than a length or width of the substrate, the target may coat the substrate by sputtering while moving along a length or width of the substrate, then the target may move along the other of the length or the width while sputtering, and then the target may move along the length or width again to coat the entire surface of the substrate. The angle of the target relative to the substrate may also be controlled (or changed) to provide indium tin oxide having a gradient (e.g., a gradient of thickness, sheet resistance, and/or light transmittance). For example, the target may have a perpendicular or non-perpendicular angle relative to a surface of the substrate, and the angle of the target relative to the substrate may be changed during the sputtering.

Figure 2:
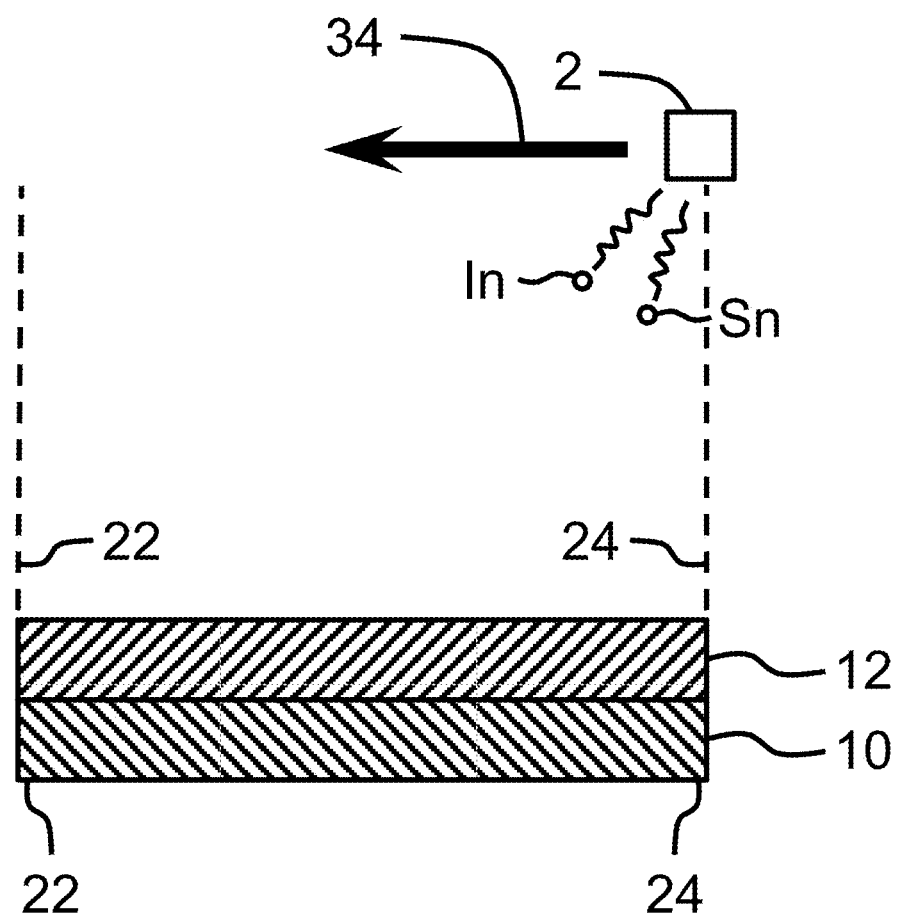

During the sputtering, the target may move from an end of the path 22 to an other end of the path 24. For example, in FIG. 1 the target 2 is at the end of the path 22 (e.g., the target 2 is over an end of the substrate 10). As the target moves from the end of the path 22 to the other end of the path 24, a first indium tin oxide layer 12 (e.g., a first moving target sputtered indium tin oxide layer) is formed, as shown in FIG. 2. In FIG. 2, the target 2 is over an other end of the substrate 10 (e.g., the other end of the path 24 is over the other end of the substrate). In some embodiments, when the target 2 is at or around the other end of the path 24, the power supply to the target is turned off, and the target stops sputtering. In other embodiments, the power is still supplied to the target when the target is at or around the other end of the path 24, and the target continues sputtering.

Figure 3:
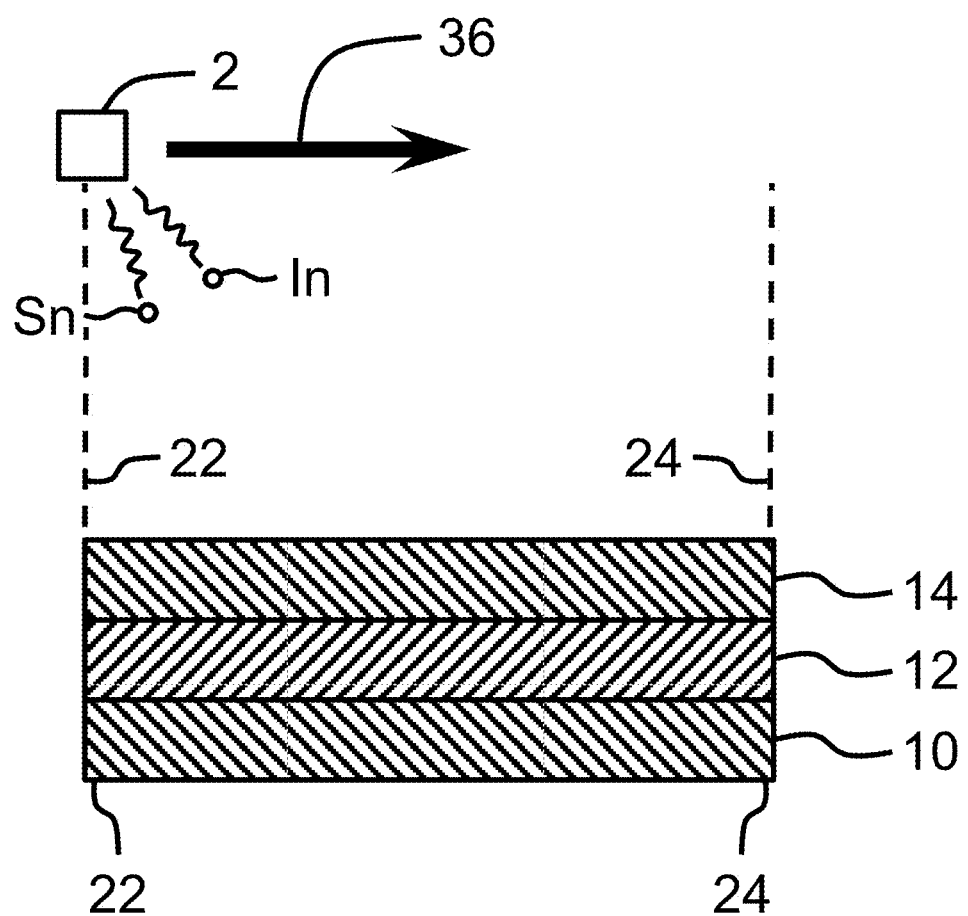
Figure 4:
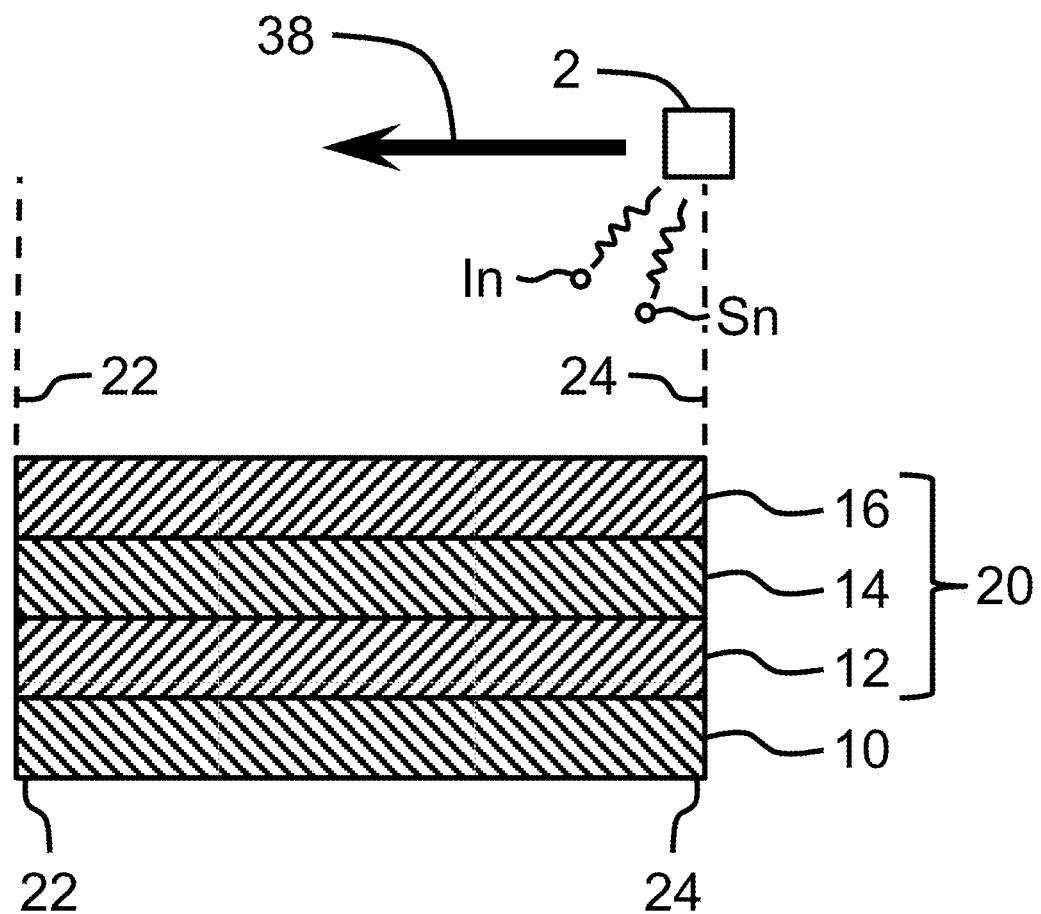

Next, the target may move along the path back to the end of the path 22 as indicated by the arrow 34 (e.g., a second direction along the path). In some embodiments, as the target moves along the second direction along the path, power to the target is turned off and the target moves without sputtering. For example, the target may move from the end of the path 22 to the other end of the path 24 while sputtering to complete a pass, and then, move from the other end of the path 24 back to the end of the path 22 without sputtering. The target may be reset to increase the sputtering rate of the target. For example, a non-conductive ceramic target may build up (or accumulate) charge on the surface of the target, which decreases the sputtering rate. Resetting the target (e.g., by relatively moving the target without sputtering) may reduce the charge build up on the target and increase the sputtering rate of the target, and/or it may prolong a lifetime of the target by reducing a build up of heat at the target. Alternatively, as the target moves along the second direction along the path, power may be supplied to the target and the target may move while sputtering. By moving (e.g., relatively moving) from the end of the path 22 to the other end of the path 24 while sputtering and then moving from the other end of the path 24 back to the end of the path 22 while sputtering, the target may complete a cycle (or loop). As shown in FIG. 3, moving the target from the other end of the path 24 to the end of the path 22 while sputtering, as indicated by the arrow 36, also forms a second layer of indium tin oxide 14 (e.g., a second moving target sputtered indium tin oxide layer) on the first layer of indium tin oxide 12. The sputtering may be performed for any suitable number of cycles or loops. In some embodiments the sputtering includes moving the target to complete a plurality of cycles or passes (e.g., 2 or more cycles or passes, 2 to 100 cycles or passes, 2 to 60 cycles or passes, 2 to 35 cycles or passes, 2 to 20 cycles or passes, 10 to 40 cycles or passes, 15 to 35 cycles or passes, or 20 to 28 cycles or passes), but the present disclosure is not limited thereto. The number of cycles or passes may be varied according to the speed and power density of the target and the desired sheet resistance of the indium tin oxide. For example, the number of cycles or passes may be decreased by decreasing the speed and/or increasing the power density of the target, and vice versa. The number of cycles or passes may also be reduced by decreasing the desired sheet resistance of the indium tin oxide. Moving the target to complete a plurality cycles or passes while sputtering forms a plurality of layers of indium tin oxide. For example, as can be seen in FIG. 4, moving the target from the end of the path 22 to the other end of the path 24 again (e.g., moving the target in the first direction along the path) forms a third indium tin oxide layer 16 (e.g., a third moving target sputtered indium tin oxide layer) on the second indium tin oxide layer 14. According to embodiments of the present disclosure, the first moving target sputtered indium tin oxide layer, the second moving target sputtered indium tin oxide layer and the third moving target indium tin oxide layer are formed utilizing the same target. The target can then be moved along the path as indicated by the arrow 38 (e.g., in the second direction along the path) back to the end of the path 22 again while sputtering or not sputtering. In some embodiments, when the target moves along the second direction along the path without sputtering, and the target has only completed one prior pass, moving the target from the end of the path 22 to the other end of the path 24 again (e.g., moving the target in the first direction along the path) forms a second indium tin oxide layer (e.g., a second moving target sputtered indium tin oxide layer) on the second indium tin oxide layer 14.

According to example embodiments of the present disclosure, as the target (or ITO plasma) moves away from a portion of the resultant indium tin oxide, the portion of the indium tin oxide anneals (e.g., anneals at a sputtering temperature). The portion of the indium tin oxide may anneal for any suitable period of time. For example, the indium tin oxide may anneal for a period of time of 1 minute or more (e.g., in a range of about 1 to about 120 minutes, about 1 to about 20 minutes, 2 minutes or more, or about 5 to about 20 minutes), as the target (or ITO plasma) moves away from the portion of the indium tin oxide, but the present disclosure is not limited thereto. As such, according to embodiments of the present disclosure, sputtering and annealing of indium tin oxide are performed concurrently (or simultaneously). For example, as the target (or ITO plasma) moves away from a portion of an indium tin oxide layer, the portion of the indium tin oxide layer from which the target moved away may anneal, and grains of the portion of the indium tin oxide layer may align to improve connectivity in the layer and thereby increase the conductivity of the layer. In some embodiments, during the annealing, the position of oxygen in the indium tin oxide layer may change or shift, thereby creating an oxygen vacancy in the indium tin oxide layer, which improves the conductivity of the indium tin oxide layer. While not intended to be limited by theory, in some embodiments, the position of oxygen in an indium tin oxide layer affects the sheet resistance of the indium tin oxide layer. Continuous sputtering from a stationary target (e.g., a target that is stationary relative to the substrate), on the other hand, does not allow indium tin oxide to anneal during a time between formation of layers of indium tin oxide, because the indium tin oxide is formed by a steady (or continuous) stream of indium, tin and oxygen, thereby preventing the indium tin oxide from annealing during the sputtering. In some embodiments, the indium tin oxide layer anneals as the target moves relative to the substrate without sputtering.

As shown in FIG. 4, the sputtering and annealing of the indium tin oxide layers forms an indium tin oxide film 20. The indium tin oxide may have any suitable thickness. The indium tin oxide (e.g., the indium tin oxide film) may have a thickness in a range of 10 nm to 4 μm, such as 10 nm to 100 nm, 100 nm to 500 nm, 500 nm to 1 μm, or 1 μm to 4 μm, depending upon the desired sheet resistance of the indium tin oxide, but the present disclosure is not limited thereto. The sheet resistances of the indium tin oxide may depend upon, for example, the thickness of the indium tin oxide, the temperature at which the indium tin oxide is deposited, the ratio of inert gas to oxygen flowed over the substrate during the sputtering, and the power density applied to the target during the sputtering. For example, the sheet resistances of the indium tin oxide deposited on a glass substrate at a temperature of 600° F., and the sheet resistance of the indium tin oxide deposited on a polymer substrate at a temperature of 150° F. are shown in Table 1.

TABLE 1

| Thickness of indium tin oxide | Sheet resistance (Ω/□) of indium tin oxide deposited on glass substrate at 600° F. | Sheet resistance (Ω/□) of indium tin oxide deposited on polymer substrate at 150° F. |
|---|---|---|
| <40 nm | 500 to 2000 | |
| 500 nm | 4 to 7 | 15 to 20 |
| 1000 nm | 2 to 3 | 7 to 10 |
| 1500 nm | 1 to 2 | 5 to 7 |
| >3000 nm | <0.5 | |

By including two or more indium tin oxide layers, indium tin oxide (e.g., an indium tin oxide film) manufactured according to example embodiments of the present invention may be made to have a lower sheet resistance and to be more flexible (or ductile) than indium tin oxide including a single layer and/or indium tin oxide manufactured by sputtering using a stationary target (e.g., a target that is stationary relative to the substrate). A single (or sole) layer of indium tin oxide formed by sputtering using a stationary target is more rigid and may crack more easily when it is distorted than indium tin oxide manufactured according to embodiments of the present disclosure. Applicants have surprisingly discovered that indium tin oxide including a plurality of layers manufactured by sputtering using a moving target according to embodiments of the present disclosure is more flexible (or ductile) and may tolerate (or sustain) some deformation without the film developing cracks, and is more conductive than indium tin oxide formed by sputtering from a stationary target. For example, according to embodiments of the present disclosure, the tensile elongation of the indium tin oxide may be 1.8%. Accordingly, indium tin oxide according to embodiments of the present disclosure is well-suited for substrates that can bend, such as polymeric (e.g., plastic) substrates. On the other hand, when the indium tin oxide is formed by continuous sputtering from a target that is stationary relative to the substrate, the substrate temperature may increase significantly as a result of heating from sputtering plasma, which may induce basecoat shrinkage on a polymeric (e.g., plastic) substrate, thereby causing the indium tin oxide to crack. For example, when the indium tin oxide is formed by continuous sputtering from a target that is stationary relative to the substrate, the temperature may increase from 100° F. to 210° F. as a result of heating from the sputtering plasma.

The sputtering disclosed herein may be performed using any suitable sputtering system (e.g., a DC magnetron sputtering system) capable of suitably moving a target while sputtering. For example, the sputtering system may include a chamber for sputtering that can be pumped down to a vacuum level in a range of $10^{-5}$ to $10^{-6}$ torr, or less, but the present disclosure is not limited thereto. The sputtering may be performed at any suitable substrate temperature, depending upon the material composition of the substrate. For example, a temperature of the substrate may be in a range of room temperature to about 700° F., or about 100 to 700° F. (500 to 700° F.), but the present disclosure is not limited thereto. As used herein, the term "room temperature" refers to a temperature in a deposition chamber under ambient conditions, for example, a temperature of about 25° C. For example, the sputtering may be performed without additional heating of the substrate or chamber. The substrate to which the indium tin oxide is to be applied may be heated (e.g., heated to a temperature in a range of 100 to 700° F.). For example, when the substrate includes a polymer (e.g., plastic), such as a polycarbonate or polyacrylate substrate, the temperature of the substrate may be in a range of 100 to 200° F. When the substrate includes a glass, such as tempered glass, the temperature of the substrate may be in a range of 400 to 700° F.

The sputtering may be performed while concurrently (or simultaneously) flowing an inert gas, such as an argon gas (e.g., a gas including or consisting essentially of argon), with the oxygen gas into the chamber and/or over the substrate. In this context, "consisting essentially of" means that any additional components in the inert gas will not materially affect the formation of the indium tin oxide. The inert gas and oxygen gas may be flowed into the chamber at any suitable flow rate. For example, an inert gas (e.g., argon) may be flowed at a flow rate in a range of 200 to 900 sccm (e.g., 100 to 600 sccm, or 200 to 600 sccm) and oxygen gas may be flowed at a flow rate in a range of 5 to 600 sccm (e.g., 5 to 400 sccm, 200 to 400 sccm, or 10 to 600 sccm), but the present disclosure is not limited thereto. In some embodiments, when the target is a ceramic target (e.g., a target including indium and tin oxide) the inert gas may be flowed over the substrate at a flow rate of 200 to 500 sccm and the oxygen gas may be flowed over the substrate at a flow rate of 5 to 40 sccm (e.g., 10 to 40 sccm). The flow rates of the inert gas and/or oxygen gas may be adjusted according to the power density and/or composition of the target. When the target is a metallic target (e.g., a target including indium and tin) the argon gas may be flowed at a flow rate of 250 to 600 sccm (e.g., 250 to 400 sccm) and the oxygen gas may be flowed at a flow rate of 100 to 400 sccm (e.g., 200 to 400 sccm). The conductivity and light transmission of the indium tin oxide may be adjusted by varying the flow rate of an oxygen gas (e.g., a gas including or consisting essentially of oxygen). For example, if the flow rate of oxygen is greater than that in the foregoing ranges, the oxygen in the indium tin oxide may be overdoped, thereby resulting in the indium tin oxide having improved light transmission but decreased electrical conductivity. A concentration of oxygen in the indium tin oxide may be controlled by adjusting an amount (e.g., flow rate) of oxygen in the deposition chamber during sputtering to provide indium tin oxide having good electrical conductivity and light transmission properties.

The sputtering may be performed by applying any suitable power density to the target. For example, the sputtering may be performed by applying a power density in a range of 0.5 to 10 kW (e.g., 0.5 to 6 kW) to the target, depending upon the size of the target, but the present disclosure is not limited thereto. For example, as the size of the target increases, the power density applied to the target may also be increased. For relatively smaller targets, a lower power density (e.g., 0.5 kW) may be applied to the target, and for relatively larger targets, a higher power density (e.g., 10 kW) may be applied to the target. In some embodiments, the power density applied to the target may be adjusted during sputtering depending upon a complexity of the substrate (e.g., depending upon the presence of a curvature or other contours at a surface of the substrate). The target may be any suitable target, such as a ceramic target including (or consisting of) indium, tin and oxygen target, or an alloy of indium and tin.

In some embodiments, the target is a distance of 4 to 12 inches (e.g., 6 to 10 inches) from the substrate during sputtering. The distance of the target from the substrate may change during sputtering, and it may depend upon the contour (or curvature) of a surface of the substrate. For example, as the thickness of the indium tin oxide layer increases, the target may be moved to maintain (or substantially maintain) the distance between the substrate and the target, and/or the target may be moved to accommodate a curvature of the substrate. The target may be moved continuously or discontinuously while sputtering. For example, the speed at which the target travels (or moves) during sputtering may be adjusted (e.g., sped up or slowed down) to account for a curvature of the substrate and to provide an indium tin oxide layer having a uniform (or substantially uniform) thickness and/or a uniform (or substantially uniform) sheet resistance. In some embodiments, the speed at which the target travels during sputtering may be controlled (e.g., sped up or slowed down) to provide an indium tin oxide layer having non-uniform thickness and/or non-uniform sheet resistance, and have non-uniform or uniform (or substantially uniform) sheet resistance. For example, the speed at which the target travels relative to the substrate may be changed to provide an indium tin oxide layer having a region having a sheet resistance that is higher (or lower) than that of another region of the indium tin oxide layer.

In some embodiments power is continuously applied to the target while sputtering. For example, a plasma (e.g., a plasma of ionized gas) may be continuously applied to the target while sputtering. The target may move relative to the substrate at any suitable rate. In some embodiments, the target moves at a rate of 20 to 200 inches per minute while sputtering, but the present disclosure is not limited thereto. For example, the target may move at a rate of 30 inches per minute while sputtering.

The sputtering may be performed for any suitable amount of time. For example, the sputtering may be performed in one example embodiment for a period of time of about 1 minute or more (e.g., about 1 to about 120 minutes, or 2 minutes or more, about 2 to about 120 minutes, or about 2 to about 40 minutes), or in another example embodiment about 10 to about 40 minutes (e.g., about 20 to about 40 minutes), but the present disclosure is not limited thereto. The time period of the sputtering may be adjusted according to, the size of the substrate, the power density of the target and the desired sheet resistance of the indium tin oxide. The time period of sputtering refers to the amount of time that the target is energized and depositing a material (e.g., indium, tin and/or oxygen) on the substrate.

The indium tin oxide according to embodiments of the present disclosure (e.g., the indium tin oxide film) may be included in a transparency, such as a transparency for a flying vehicle (e.g., aircraft), but the present disclosure is not limited thereto. The flying vehicle may be any suitable aircraft, such as a jet aircraft (commercial passenger, cargo, private or military) or a propeller aircraft (commercial passenger, cargo, private or military), such as a tiltrotor aircraft, but the present disclosure is not limited thereto.

Figure 5:
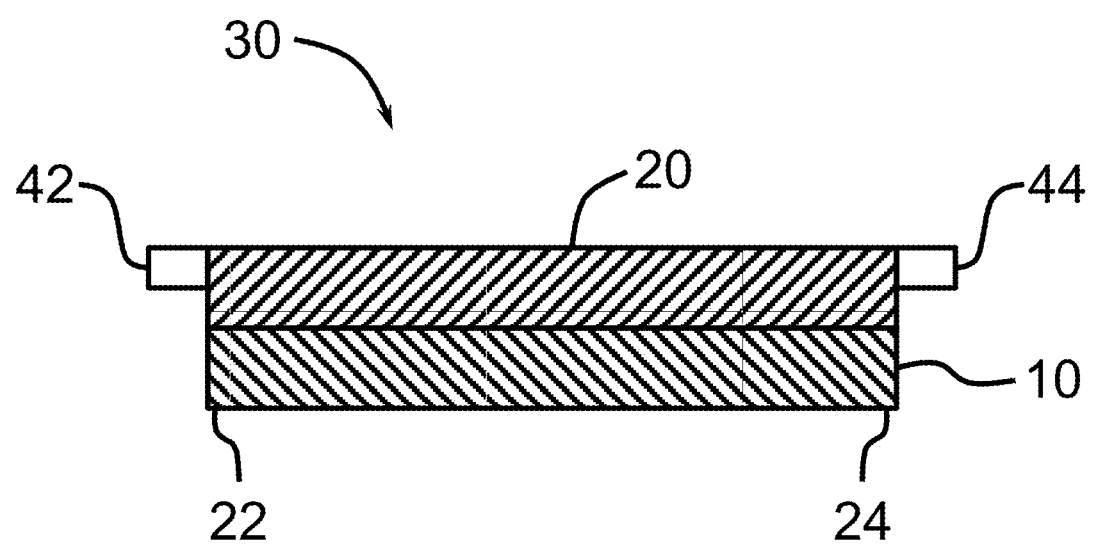
FIG. 5 is a cross-sectional view of a transparency including an indium tin oxide film according to an embodiment of the present invention.

Additional features and layers (e.g., films) of a transparency according to embodiments of the present disclosure will now be described. Depending upon the particular embodiment, these additional features and/or layers may or may not be present in the transparency. For example, a transparency 30 according to an example embodiment of the present invention is shown in FIG. 5. The transparency 30 includes the substrate 10 and the indium tin oxide film 20. The indium tin oxide film 20 may serve as an anti-static layer (e.g., a charge drain layer), an EMI shielding layer, and/or a heater layer. The transparency 30 further includes leads or tabs 42 and 44 for grounding the indium tin oxide film 20. For example, the leads or tabs may be configured to ground the indium tin oxide film 20 to a flying vehicle (e.g., an aircraft), for example when the transparency is mounted in a flying vehicle and the indium tin oxide film functions as an anti-static layer (e.g., a charge drain layer) and/or an EMI shielding layer. In some embodiments, the leads or tabs 42 and 44 supply an electric current to the indium tin oxide film 20, for example when the transparency is included in a flying vehicle and the indium tin oxide film functions as a heater layer. The indium tin oxide film 20 in one example embodiment may have a sheet resistance in a range of 0.3 to less than $0.5\Omega/\square$ (e.g., 0.35 to $0.48\Omega/\square$), 1 to 5 $\Omega/\square$, 5 to $10\Omega/\square$, or 10 to 20 $\Omega/\square$.

Embodiments of the indium tin oxide of the present disclosure may be used to replace other transparent conductive films such as those formed by lithographically printing metal gridlines, inkjet printing conductive gridlines, or by using a woven wire mesh, which may be more costly to manufacture than the indium tin oxide of the present disclosure. For example, example embodiments of the indium tin oxide of the present disclosure may be used as a heater film on a shielding panel or transparency to replace woven wire mesh or lithographically patterned thin films. As shown below, using a power level of 1300 watts and a voltage of 28 direct current volts (e.g., a typical aircraft voltage), a heater film (or layer) having a sheet resistance less than $0.6\Omega/\square$ is expected to be able to suitably heat any suitable transparency having an area of 1115 square inches. Table 2 below includes the calculated voltage (v) for suitably heating a transparency having a heater film area of 1115 square inches at various heater film sheet resistances (R) and a power consumption of 1300 Watts.

TABLE 2

| R ($\Omega/\square$) | Voltage (V) | Heater area (square inches) | Power Consumption (Watts) |
|---|---|---|---|
| 37.23 | 220 | 1115 | 1300 |
| 11.07 | 120 | 1115 | 1300 |
| 0.6 | 28 | 1115 | 1300 |

An EMI shielding layer including indium tin oxide according to an example embodiment of the present disclosure may provide 99.99% or greater EMI shielding at a frequency of 10 GHz, but the present disclosure is not limited thereto. For example, an indium tin oxide film having a thickness of about 3.9 μm and a low sheet resistance of less than $0.5\Omega/\square$ may achieve a shielding effectiveness (S.E.) of about 40 dB. Such a film may be prepared using (utilizing) a metallic alloy target including 90 to 95 wt % of indium and 5 to 10 wt % of tin (90 wt % indium and 10 wt % tin, or 93 wt % indium and 7 wt % tin). The EMI shielding effectiveness of an EMI shielding layer may be calculated according to the following equation in which R is the sheet resistance and f is the frequency of the EMI.

Shielding effectiveness(SE)=20 log $[(7 \cdot 10^{11})/(f \cdot R)]$

Table 2 below illustrates the correlation between sheet resistance (R), EMI frequency (f), shielding effectiveness (SE) and shielding effectiveness percentage for an EMI shielding layer of a transparency.

TABLE 2

| R ($\Omega/\square$) | GHz | SE (dB) | SE (%) |
|---|---|---|---|
| 10 | 10 | 17 | 97 |
| 1 | 10 | 37 | 99.9 |
| 0.5 | 10 | 43 | 99.99 |

The transparency may include additional layers, such as any suitable adhesive or tie layer, any suitable base layer, and/or any suitable topcoat. The topcoat may be on any of the other layers of the transparency (e.g., the substrate and/or the indium tin oxide film). The adhesive or tie layer and/or base layer may be on or between any other layers of the transparency (e.g., substrate, the indium tin oxide film, the topcoat, the adhesive or tie layer and/or the base layer).

Example embodiments of the present disclosure will now be described with respect to the following examples. The present disclosure, however, is not limited thereto.

Example 1

Indium tin oxide was prepared using a direct current (DC) magnetron sputtering apparatus. Sputtering was performed using an indium and tin alloy target (about 93 wt % indium and 7 wt % tin, based on the total weight of the target) powered by a pulsed DC magnetron power supply (available from Advanced Energy) at an output power (power density) of about 4.5 kW. During the sputtering, an argon gas was flowed over the substrate at an argon gas flow rate of about 500 sccm and an oxygen gas was flowed over the substrate at an oxygen gas flow rate of about 350 sccm. The temperature of the substrate during the sputtering was about 650° F. During the sputtering, the target was moved at a rate of about 30 inches per minute for a total of 24 cycles (or loops) to form indium tin oxide on a glass substrate.

Figure 6:
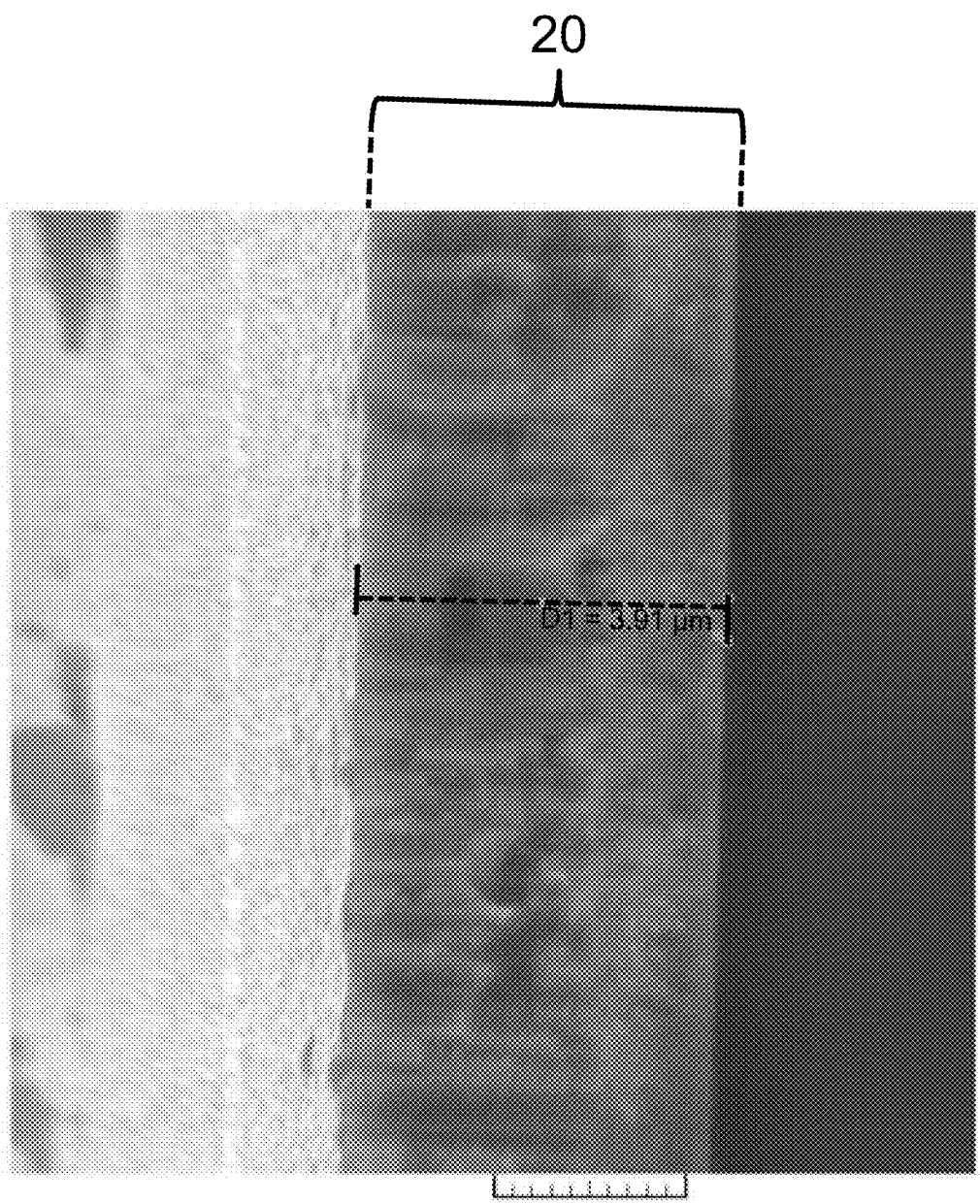
FIG. 6 is an SEM photograph of indium tin oxide prepared according to an embodiment of the present disclosure.

A scanning electron microscope (SEM) photograph of the indium tin oxide 20 prepared in Example 1 is shown in FIG. 6. Using the SEM, a thickness of the indium tin oxide 20 prepared in Example 1 was measured as being 3.91 µm. As can be seen in FIG. 6, the indium tin oxide 20 prepared in Example 1 included a plurality of layers of indium tin oxide including 24 layers (i.e., one layer corresponding to each cycle).

Example 2

Indium tin oxide was prepared using the DC magnetron sputtering apparatus. Sputtering was performed using a ceramic target including about 93 wt % $In_2O_3$ and 7 wt % $Sn_2O_4$, based on the total weight of the target, powered by the magnetron DC power supply at an output power (power density) of about 5.5 kW. During the sputtering, an argon gas was flowed over the substrate at an argon gas flow rate of about 600 sccm and an oxygen gas was flowed over the substrate at an oxygen gas flow rate of about 20 sccm. The temperature of the substrate during the sputtering was about 170° F. During the sputtering, the target was moved at a rate of about 30 inches per minute for a total of 16 cycles (or loops) to form indium tin oxide on a polycarbonate substrate including an acrylic and polysiloxane basecoat. The above-described layer by layer deposition of the indium tin oxide layer deposition process provided a more ductile, low resistance indium tin oxide layer on a plastic substrate.

Figure 7:
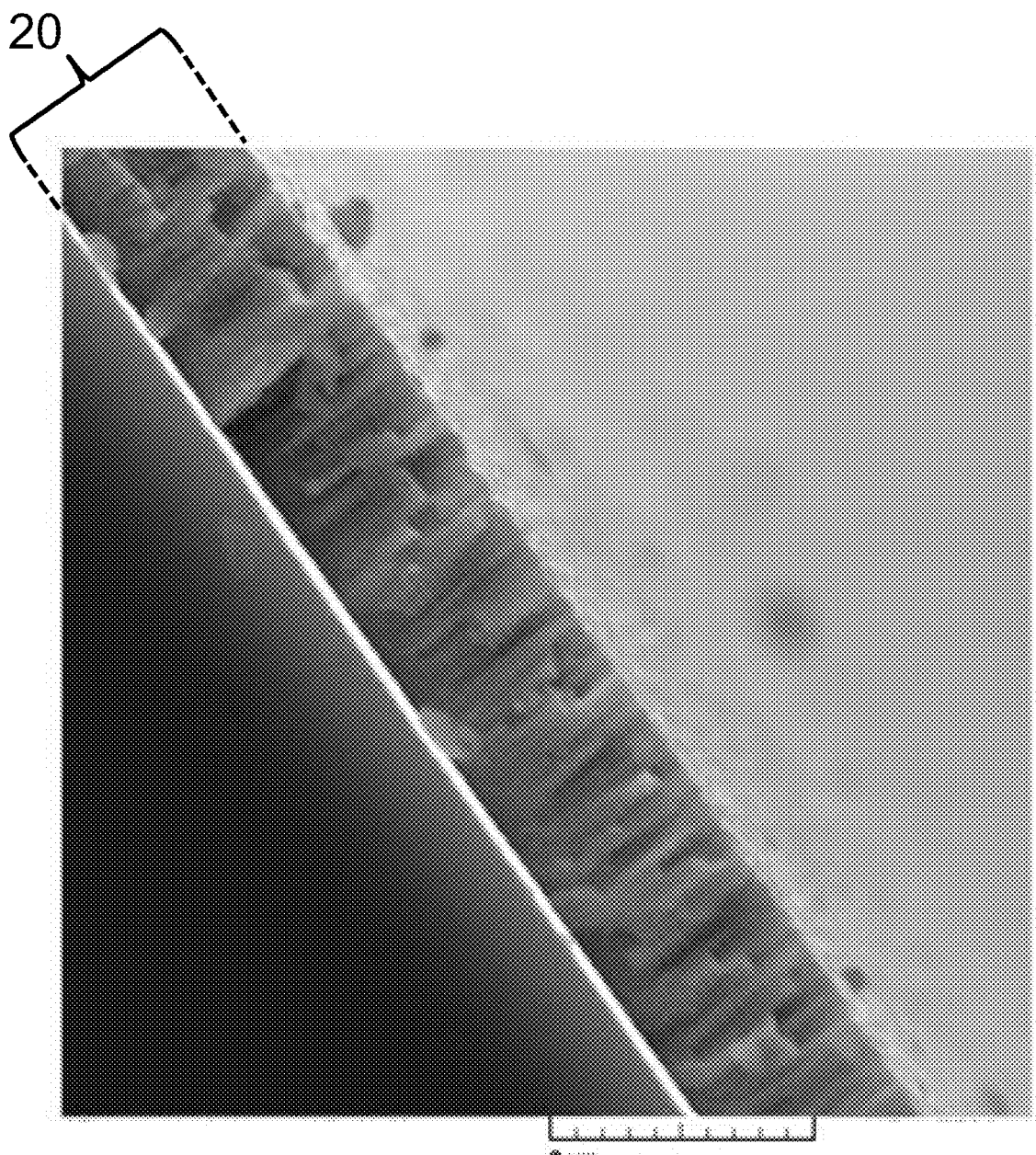
FIG. 7 is an SEM photograph of indium tin oxide prepared according to an embodiment of the present disclosure.

A scanning electron microscope (SEM) photograph showing a cross-sectional view of the indium tin oxide 20 prepared in Example 2 is shown in FIG. 7. Using the SEM, a thickness of the indium tin oxide 20 prepared in Example 2 was measured as being 1.4 µm. As can be seen in FIG. 7, the indium tin oxide 20 prepared in Example 2 included a plurality of layers of indium tin oxide including 16 layers (i.e., one layer corresponding to each cycle).

Comparative Example 1

Indium tin oxide was prepared using the pulsed DC magnetron sputtering apparatus. Sputtering was performed using an indium and tin alloy target (about 93 wt % indium and 7 wt %, based on the total weight of the target) powered by a DC magnetron power supply at an output power (power density) of about 4.5 kW. During the sputtering, an argon gas was flowed over the substrate at an argon gas flow rate of about 500 sccm and an oxygen gas was flowed over the substrate at an oxygen gas flow rate of about 350 sccm. The temperature of the substrate during the sputtering was about 650° F. The target was kept stationary while sputtering for a time of about 30 minutes to form indium tin oxide on a glass substrate.

Figure 8:
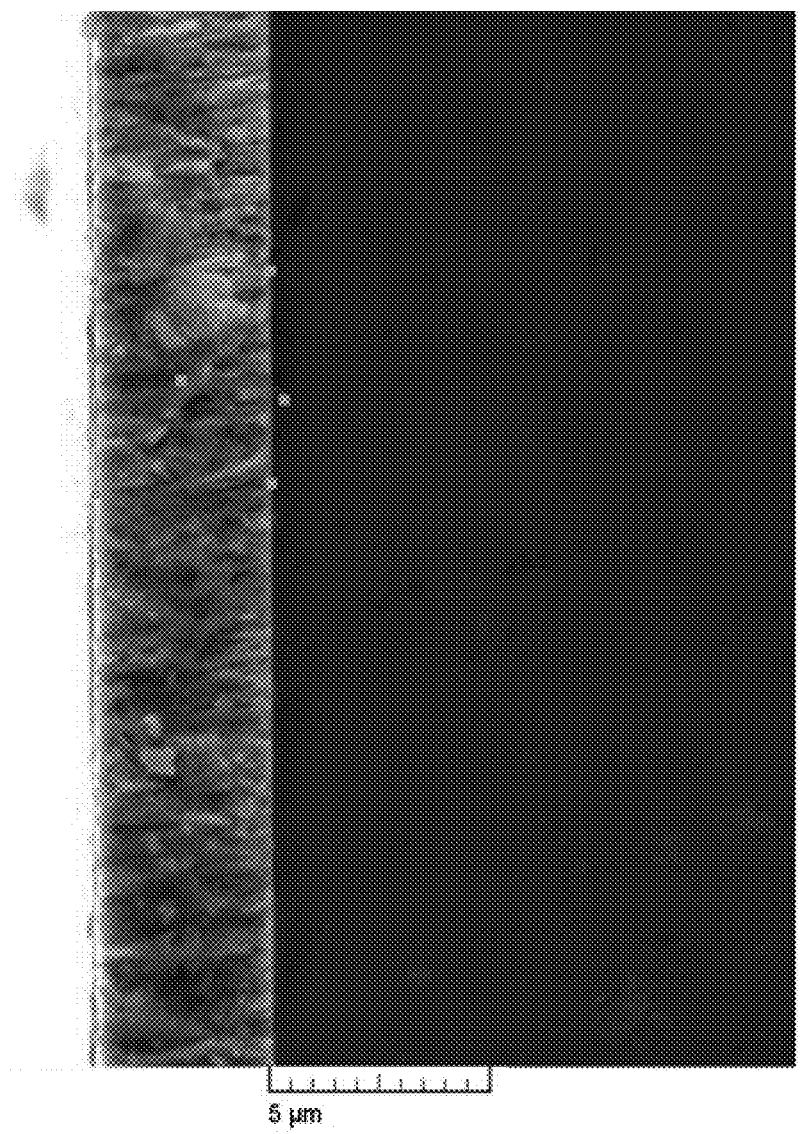
FIG. 8 is an SEM photograph of indium tin oxide prepared according to a comparative embodiment.

A scanning electron microscope (SEM) photograph showing a cross-sectional view of the indium tin oxide prepared in Comparative Example 1 is shown in FIG. 8. Using the SEM, a thickness of the indium tin oxide prepared in Comparative Example 1 was measured as being 3.99 µm. As can be seen in FIG. 8, the indium tin oxide prepared in Comparative Example 1 included only a single layer of indium tin oxide having a columnar structure.

Luminous Transmittance Tests 12 inch by 12 inch coupons prepared according to Examples 1 and 2 and Comparative Example 1, respectively, were each tested according to ASTM D1003 using a Haze-Gard Plus instrument. Luminous or visible light transmittance indicates the amount of visible light transmitted through the sample. The coupons according to Examples 1 and 2 exhibited a visible light transmittance of 66.5% and about 75%, respectively, while the coupon according to Comparative Example 1 exhibited a visible light transmittance of 66.8%.

Sheet Resistance Test 12 inch by 12 inch coupons prepared according to Examples 1 and 2 and Comparative Example 1, respectively, were each tested using a four point probes surface resistivity meter from Guardian Manufacturing Inc. The sheet resistances of the indium tin oxide films of Examples 1 and 2 were measured as 0.39Ω/□ and 10Ω/□, respectively. The sheet resistance of the indium tin oxide film of Comparative Example 1 was measured as 0.5 Ω/□.

While the subject matter disclosed herein has been described in connection with certain embodiments, it is to be understood that the present disclosure is not limited to the disclosed embodiments, but, on the contrary, is intended to cover various modifications and equivalent arrangements included within the spirit and scope of the appended claims, and equivalents thereof. Throughout the text and claims, use of the word "about" reflects the penumbra of variation associated with measurement, significant figures, and interchangeability, all as understood by a person having ordinary skill in the art to which this disclosure pertains. Additionally, throughout this disclosure and the accompanying claims, it is understood that even those ranges that may not use the term "about" to describe the high and low values are also implicitly modified by that term, unless otherwise specified. In the claims, means-plus-function clauses are intended to cover the structures described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures. It is the express intention of the applicant not to invoke 35 U.S.C. § 112, paragraph 6 for any limitations of any of the claims herein, except for those in which the claim expressly uses the words "means for" together with an associated function.

What is claimed is:

1. An indium tin oxide film comprising indium tin oxide manufactured according to a method comprising:
sputtering indium and tin from a target onto a substrate to form the indium tin oxide over the substrate, the sputtering comprising moving the target relative to the substrate along a path over the substrate,
wherein the indium tin oxide film has a total thickness in a range of greater than 3 µm to 4 µm,
wherein the moving of the target comprises moving the target from an end of the path to an other end of the path during the sputtering of the indium and the tin from the target onto the substrate,
wherein during the sputtering of the indium and the tin from the target onto the substrate the target does not move substantially past the end of the path or the other end of the path,
wherein the end of the path is over an end of the substrate and the other end of the path is over an other end of the substrate,
wherein the indium tin oxide film comprises a first layer of indium tin oxide and a second layer of indium tin oxide over the first layer of indium tin oxide,
wherein a sheet resistance of the indium tin oxide film is in a range of 0.3 to less than 0.5 Ω/□,
wherein the indium tin oxide film is connected to one selected from a tab and a lead, and
the one selected from the tab and the lead grounds the indium tin oxide film.

2. The indium tin oxide film of claim 1, wherein the moving of the target from the end of the path to the other end of the path forms the first layer of indium tin oxide.

3. The indium tin oxide film of claim 2, further comprising moving the target from the other end of the path to the end of the path to complete a cycle.

4. The indium tin oxide film of claim 3, wherein the moving of the target comprises completing a plurality of cycles.

5. The indium tin oxide film of claim 3, wherein the moving of the target comprises completing 2 or more cycles.

6. The indium tin oxide film of claim 2, further comprising moving the target from the other end of the path to the end of the path to form the second layer of indium tin oxide over the first layer of indium tin oxide.

7. The indium tin oxide film of claim 6, further comprising moving the target from the end of the path to the other end of the path to form a third layer of indium tin oxide over the second layer of indium tin oxide.

8. The indium tin oxide film of claim 1, wherein the sputtering is performed at a temperature in a range of room temperature to 700° F.

9. The indium tin oxide film of claim 1, wherein the sputtering is performed for a period of time in a range of about 1 minute or more.

10. The indium tin oxide film of claim 1, wherein the sputtering is performed while flowing an inert gas over the substrate at an inert gas flow rate in a range of about 100 to about 600 sccm, and while flowing an oxygen gas over the substrate at an oxygen gas flow rate in a range of about 5 to 400 sccm.

11. The indium tin oxide film of claim 1, wherein a portion of the indium tin oxide anneals as the target moves away from the portion of the indium tin oxide.

12. The indium tin oxide film of claim 1, wherein the moving the target relative to the substrate comprises moving the target and/or the substrate.

13. An indium tin oxide film comprising indium tin oxide manufactured according to a method comprising:
sputtering indium and tin from a target onto a substrate to form the indium tin oxide over the substrate, the sputtering comprising moving the target relative to the substrate along a path over the substrate to form a plurality of indium tin oxide layers,
wherein the indium tin oxide film has a total thickness in a range of greater than 3 µm to 4 µm,
wherein the plurality of indium tin oxide layers of the indium tin oxide film comprises a first layer of indium tin oxide and a second layer of indium tin oxide over the first layer of indium tin oxide,
wherein a sheet resistance of the indium tin oxide film is in a range of 0.3 to less than 0.5 Ω/□,
wherein the moving of the target comprises moving the target from an end of the path to an other end of the path during the sputtering of the indium and the tin from the target onto the substrate,
wherein during the sputtering of the indium and the tin from the target onto the substrate the target does not move substantially past the end of the path or the other end of the path,
wherein the end of the path is over an end of the substrate and the other end of the path is over an other end of the substrate,
wherein the indium tin oxide film is connected to one selected from a tab and a lead, and
the one selected from the tab and the lead grounds the indium tin oxide film.

14. An indium tin oxide film comprising indium tin oxide:
wherein the indium tin oxide film has a total thickness in a range of greater than 3 µm to 4 µm,
wherein the indium tin oxide film comprises a first layer of indium tin oxide and a second layer of indium tin oxide over the first layer of indium tin oxide,
wherein a sheet resistance of the indium tin oxide film is in a range of 0.3 to less than 0.5 Ω/□,
wherein the indium tin oxide film is connected to one selected from a tab and a lead, and
the one selected from the tab and the lead grounds the indium tin oxide film.

* * * * *